US011342417B2

(12) United States Patent
Tsui et al.

(10) Patent No.: US 11,342,417 B2
(45) Date of Patent: May 24, 2022

(54) SEMICONDUCTOR STRUCTURE OF TRENCH TRANSISTORS AND MANUFACTURING METHOD THEREOF

(71) Applicant: NATIONAL CHIAO TUNG UNIVERSITY, Hsinchu (TW)

(72) Inventors: Bing-Yue Tsui, Hsinchu (TW); Fang-Hsin Lu, Taoyuan (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 26 days.

(21) Appl. No.: 17/011,506

(22) Filed: Sep. 3, 2020

(65) Prior Publication Data
US 2021/0376087 A1 Dec. 2, 2021

(30) Foreign Application Priority Data
May 29, 2020 (TW) .................. 109117956

(51) Int. Cl.
H01L 29/10 (2006.01)
H01L 29/423 (2006.01)
(Continued)

(52) U.S. Cl.
CPC ...... H01L 29/1095 (2013.01); H01L 21/0273 (2013.01); H01L 29/4236 (2013.01); H01L 29/66734 (2013.01); H01L 29/7813 (2013.01)

(58) Field of Classification Search
CPC ............. H01L 29/1095; H01L 29/4236; H01L 29/66734; H01L 29/7813
See application file for complete search history.

(56) References Cited

U.S. PATENT DOCUMENTS 5,614,749 A 3/1997 Ueno
7,294,550 B2 11/2007 Tsui
(Continued)

FOREIGN PATENT DOCUMENTS

TW I222685 B 10/2004

OTHER PUBLICATIONS

M.H. Juang et al., "Fabrication of trench-gate power MOSFETs by using a dual doped body region," Solid-State Electronics, 2004, vol. 48, pp. 1079-1085.
(Continued)

Primary Examiner — Joseph C. Nicely
(74) Attorney, Agent, or Firm — Rabin & Berdo, P.C.

(57) ABSTRACT

A structure of trench transistors includes the following elements. A substrate serves as a drain of the structure of trench transistors. An epitaxial layer is disposed on the substrate. A plurality of trenches are disposed in the epitaxial layer. A plurality of gate insulator layers are respectively disposed on the inner surfaces of the trenches. A plurality of gates are respectively disposed on the gate insulator layers. A plurality of first base regions are respectively disposed in the epitaxial layer between the adjacent trenches, and have a first depth from the top surface of the epitaxial layer. A plurality of second base regions are respectively disposed in the epitaxial layer adjacent to the sidewalls of the trenches, and each has a second depth from the bottom surface of the first base region. A plurality of sources are respectively disposed in the first base region beside the sidewalls of the trenches.

8 Claims, 8 Drawing Sheets

(51) Int. Cl.
*H01L 29/78* (2006.01)
*H01L 29/66* (2006.01)
*H01L 21/027* (2006.01)

(56) References Cited

U.S. PATENT DOCUMENTS

| | | | | |
|---|---|---|---|---|
| 2009/0289264 | A1* | 11/2009 | Matsuki | H01L 21/0475 257/77 |
| 2012/0032261 | A1* | 2/2012 | Hsieh | H01L 29/0696 257/334 |
| 2018/0138310 | A1* | 5/2018 | Baba | H01L 21/02233 |
| 2018/0366549 | A1* | 12/2018 | Kojima | H01L 29/7813 |
| 2019/0088750 | A1* | 3/2019 | Katou | H01L 29/0696 |
| 2019/0305079 | A1* | 10/2019 | Osuga | H01L 29/086 |
| 2020/0144412 | A1* | 5/2020 | Ohashi | H01L 21/0465 |
| 2021/0151590 | A1* | 5/2021 | Oshino | H01L 21/2253 |
| 2021/0296489 | A1* | 9/2021 | Kishimoto | H01L 27/088 |
| 2021/0305369 | A1* | 9/2021 | Nakano | H01L 29/7813 |
| 2022/0013666 | A1* | 1/2022 | Urakami | H01L 29/417 |

OTHER PUBLICATIONS

Shinsuke Harada et al., "3.3-kV-Class 4H-SiC MeV-Implanted UMOSFET With Reduced Gate Oxide Field," IEEE Electron Device Letters, Mar. 2016, vol. 37, No. 3, pp. 314-316.
Toshiya Kawashima, "Narrow-Pitch N-Channel Superjunction UMOSFET for 40-60 V Automotive Application," Proceedings of The 22nd International Symposium on Power Semiconductor Devices & ICs, Hiroshima, pp. 329-332.
Yusuke Kobayashi et al., "3.3 kV-class 4H-SiC UMOSFET by Double-trench with Tilt Angle Ion Implantation," Materials Science Forum, 2016, ISSN: 1662-9752, vol. 858, pp. 974-977.

* cited by examiner

SEMICONDUCTOR STRUCTURE OF TRENCH TRANSISTORS AND MANUFACTURING METHOD THEREOF

FIELD OF TECHNOLOGY

The invention relates to a structure of trench transistors, in particular to a structure of trench transistors having an inverted U-shaped (also known as saddle-like) base region.

BACKGROUND

A U-shaped gate metal-oxide-semiconductor field-effect transistor (U-MOSFET) belongs to a branch of power metal-oxide-semiconductor field-effect transistor (power MOSFET). The U-MOSFET is characterized by its U-shaped trench structure that can reduce the turn-on resistance and power consumption of the transistor, making the U-MOSFET the mainstream of power devices.

However, in the process of manufacturing the U-MOSFET, if silicon carbide (SiC) is selected as a substrate, for example, a p-type dopant used is usually aluminum (Al). Since the diffusion coefficient of Al in SiC is extremely small, Al ions must be implanted with energy higher than 1 MeV, or even 2 MeV, to reach a depth of about 1-2 μm usually needed by a p-base region. Moreover, in order to make the implanted Al ion concentration have a uniform distribution in the substrate vertically, it is also necessary to perform the ion implantation with multiple energies, which may lead to longer process time and higher cost. Not to mention an ion implantation machine that can perform the ion implantation of MeV-level is far more expensive and bulky.

In summary, how to overcome the shortcomings of the ion implantation process for forming the base region of the U-MOSFET and reduce the required process cost and time is a problem to be solved in this technical field.

SUMMARY

In order to solve the above-mentioned problems, a structure of trench transistors is provided. By adjusting the process and tilted angle of the ion implantation process in an epitaxial layer of the U-MOSFET, the structure of trench transistors is further improved to have an inverted U-shaped (that is, saddle-like) base region formed between two adjacent gates. The inverted U-shaped base region may be roughly divided into a first base region corresponding to the top of the inverted alphabet "U" and two second base regions corresponding to two sides of the inverted alphabet "U".

According to an embodiment of the invention, a structure of trench transistors is provided. The structure of trench transistors comprises a substrate, an epitaxial layer, a plurality of trenches, a plurality of gate insulating layers, a plurality of gates, a plurality of first base regions, a plurality of second base regions, and a plurality of sources. The substrate has a first conductive type and serves as a drain of the structure of trench transistors. The epitaxial layer is disposed on the substrate and has the first conductive type. The trenches are disposed in the epitaxial layer. The gate insulating layers are disposed on the inner surfaces of the trenches. The gates are respectively disposed on the gate insulating layers. The first base regions are respectively disposed in the epitaxial layer between the adjacent trenches, have a first depth from the top surface of the epitaxial layer, and have a second conductive type opposite to the first conductive type. The second base regions are respectively disposed in the epitaxial layer beside sidewalls of the trenches, have a second depth from the bottom surface of the first base regions, and have the second conductive type, wherein the second depth is larger than the first depth. The sources are respectively disposed in the first base regions beside the sidewalls of the trenches and have the first conductive type.

According to another embodiment of the invention, the structure of trench transistors further comprises a plurality of dielectric layers respectively covering the gates.

According to still another embodiment of the invention, the structure of trench transistors further comprises a plurality of hard mask layers respectively disposed on the epitaxial layer and surrounding sidewalls of the gate insulating layers. Moreover, the structure of trench transistors further comprises a plurality of dielectric layers respectively covering the gates and the hard mask layers.

According to still another embodiment of the invention, the structure of trench transistors further comprises a plurality of base-contacting regions disposed in the first base regions between the adjacent sources and having the second conductive type. Moreover, the structure of trench transistors further comprises a plurality of dielectric layers respectively covering the gates.

According to still another embodiment of the invention, the structure of trench transistors further comprises a plurality of base-contacting regions disposed in the first base regions between the adjacent sources and having the second conductive type. Moreover, the structure of trench transistors further comprises a plurality of hard mask layers respectively disposed on the epitaxial layer and surrounding sidewalls of the gate insulating layers. Moreover, the structure of trench transistors further comprises a plurality of dielectric layers respectively covering the gates and the hard mask layers.

Additionally, a manufacturing method of a structure of trench transistors is also provided. The manufacturing method of a structure of trench transistors comprises the following steps. An epitaxial layer is formed on a substrate, wherein both the epitaxial layer and the substrate have a first conductive type and the substrate is served as a drain. A plurality of sources are formed under the top surface of the epitaxial layer, wherein the sources have the first conductive type. A plurality of first base regions are formed in the epitaxial layer to surround the sources, wherein the first base regions have a second conductive type. A plurality of trenches are formed in the epitaxial layer and respectively penetrate the sources. A plurality of second base regions are formed respectively surrounding sidewalls and bottoms of the trenches in the epitaxial layer, wherein the second base regions have the second conductive type. The trenches is continuingly etched to penetrate the second base regions. A plurality of gate insulating layers are formed respectively on the inner surfaces of the sidewalls and the bottoms of the trenches. A plurality of gates are formed respectively in the trenches.

According to another embodiment of the invention, the manufacturing method further comprises forming a plurality of base-contacting regions respectively in the first base regions on two sides of the sources between the steps of forming the sources and the first base regions.

According to still another embodiment of the invention, the manufacturing method further comprises forming a plurality of dielectric layers respectively on the gates.

According to still another embodiment of the invention, the second base regions are formed by tilted ion implantation.

According to still another embodiment of the invention, an ion implantation energy of the tilted ion implantation is 10-1,000 keV.

According to still another embodiment of the invention, the trenches are formed by the following steps. An etching mask layer is formed on the epitaxial layer. A photoresist layer is formed on the etching mask layer. The photoresist layer is patterned to expose a portion of the etching mask layer. The exposed etching mask layer is etched to expose a portion of the epitaxial layer. The exposed epitaxial layer is etched to form the trenches. The etching mask is removed.

According to still another embodiment of the invention, the first base regions are formed by the following steps. A hard mask layer is formed on the epitaxial layer. A photoresist layer is formed on the hard mask layer. The photoresist layer is patterned to expose a portion of the hard mask layer. The exposed hard mask layer is etched to expose a portion of the epitaxial layer. The ions are implanted into the exposed epitaxial layer.

According to still another embodiment of the invention, the structure of trench transistors further comprises a plurality of dielectric layers respectively covering the gates and the hard mask layer.

According to still another embodiment of the invention, the hard mask layer is removed after implanting the ions into the exposed epitaxial layer. For example, the structure of trench transistors further comprises a plurality of dielectric layers respectively covering the gates and the hard mask layer.

Accordingly, the embodiments of the invention may achieve the following results.

(1) The implantation energy and the implantation number of the ion implantation process for forming a base region (such as p-base region) of the U-MOSEFT are reduced, so the required process time and cost may be significantly saved.

(2) The junction capacitance ($C_{B-D}$) of the base region and the drain region of the U-MOSFET and the accumulated charge ($Q_{B-D}$) caused by the junction capacitance are reduced, so as to accelerate the on/off switching rate of electronic devices.

BRIEF DESCRIPTION OF THE DRAWINGS

In order to clearly illustrate the above and other objects, features, advantages and embodiments of the invention, the description of the attached drawings are provided as below.

DETAILED DESCRIPTION

To solve the above problems, a structure of trench transistors (or so-called U-MOSFET) and manufacturing method thereof are provided. In the manufacturing method, the structure of trench transistors may have an inverted U-shaped (that is, saddle-like) base region disposed between two adjacent gates by adjusting the ion implantation process and tilted angle of the process in an epitaxial layer of the U-MOSFET.

The inverted U-shaped base region may be roughly divided into a first base region corresponding to the top of the inverted alphabet "U" and two second base regions corresponding to two sides of the inverted alphabet "U". In other words, the first base region is disposed between the adjacent trench gates and has a relatively shallow first depth. The second base regions on both sides are respectively disposed adjacent to the sidewalls of the trench gates and have a relatively deep second depth. Therefore, in the longitudinal section of the entire base region (including the first base region and the second base region), the entire base region will show a shape with two longer sides and shorter in the middle, which is similar to the inverted U-shaped (saddle like) base region.

Specifically, FIGS. 1A-1H are sectional structure diagrams of a manufacturing method of a structure of trench transistors according to an embodiment of the invention.

Figure 1A:
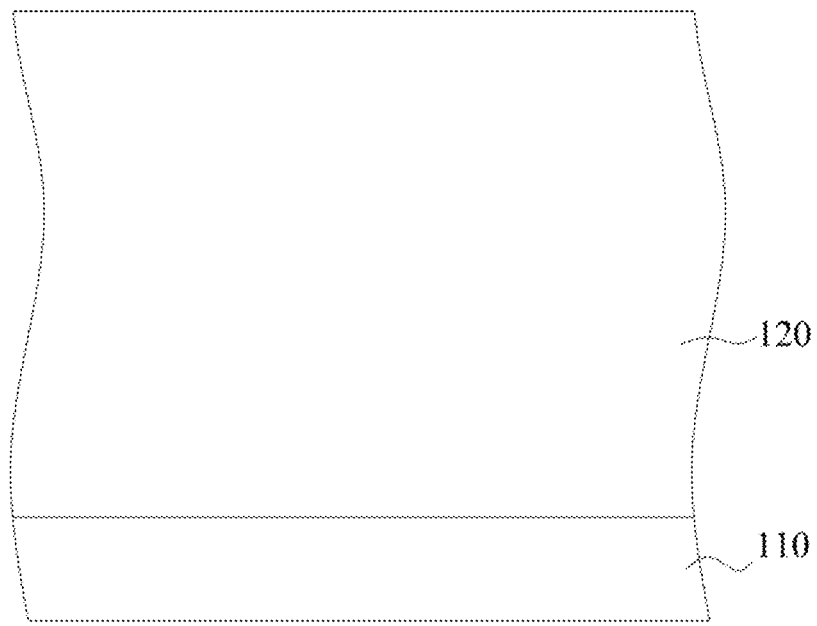
FIGS. 1A-1H are sectional structure diagrams of a manufacturing method of a structure of trench transistors according to an embodiment of the invention.

In FIG. 1A, an epitaxial layer 120 is formed on a substrate 110. The epitaxial layer 120 having the first conductive type (for example, n-type) is directly formed on the substrate 110 also having the first conductive type (for example, n-type). That is, the epitaxial layer 120 is disposed directly on the top surface of the substrate 110, so that the substrate 110 may serve as a drain 110 of a structure of trench transistors 100.

The materials of the substrate 110 and the epitaxial layer 120 may be, for example, silicon carbide (SiC), gallium nitride (GaN), silicon (Si), gallium oxide ($Ga_2O_3$), aluminum nitride (AlN), diamond (C), etc. The method for forming the epitaxy layer 120 may be, for example, vapor phase epitaxy or molecular beam epitaxy (MBE), etc. In addition, a conductive layer (not shown in the figure) may be used to contact the substrate 110 and serve as a wire for the drain 110. The material of the conductive layer may be any available conductive materials (such as nickel, aluminum, titanium, copper, etc.) with a thickness of about 0.2-4 μm.

Figure 1B:
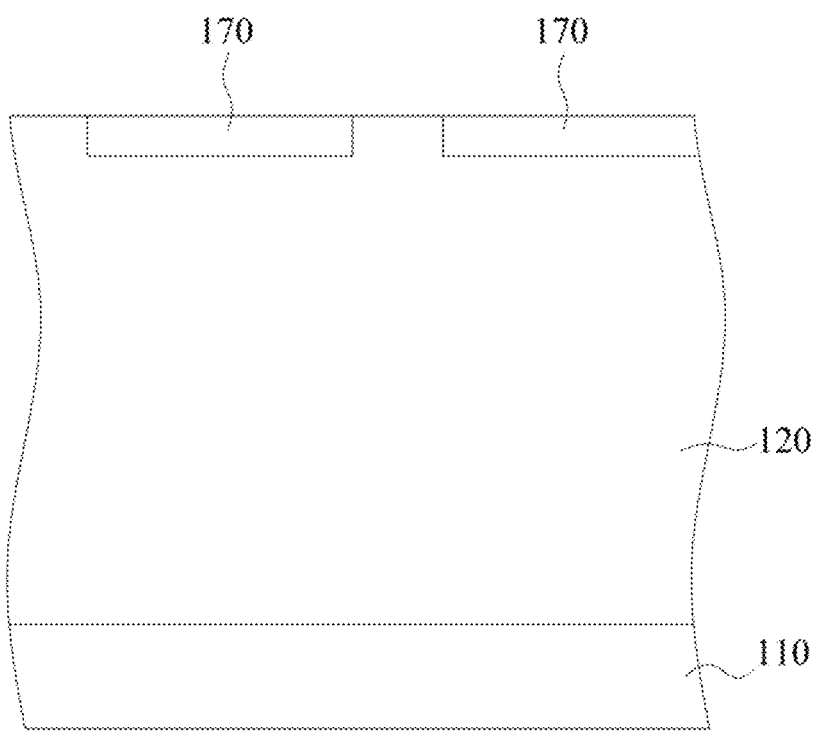

In FIG. 1B, a plurality of sources 170 are formed. The method of forming the sources 170 comprises the following steps. First, a patterned hard mask layer (not shown in the figure) having a pattern corresponding to the sources 170 is formed. Next, ions are implanted into the exposed epitaxial layer 120 to form the sources 170. The sources 170 have the same first conductive type (for example, n-type) as the epitaxial layer 120 due to the implantation of dopants. Then, the hard mask layer is removed.

The method of forming the patterned hard mask layer comprises the following steps. First, the hard mask layer is formed on the epitaxial layer 120. The materials of the hard mask layer may be, for example, silicon oxide, silicon nitride, or silicon oxynitride. The method of forming the hard mask layer may be, for example, chemical vapor deposition (CVD). The thickness of the hard mask layer must be sufficiently thick to protect the epitaxial layer 120 from ion bombardment in the subsequent ion doping process.

Next, a photoresist layer (not shown in the figure) is formed on the hard mask layer. The photosensitive materials of the photoresist layer may be positive photoresist materials or negative photoresist materials, such as phenol formaldehyde resins or polyisoprene.

Then, a photolithography process is performed to allow the photoresist layer to have a desired pattern to expose a portion of the hard mask layer. Then, the pattern of the photoresist layer is transferred to the hard mask layer thereunder, that is, the exposed hard mask layer is etched to expose a portion of the epitaxial layer 120. The etching method of the hard mask layer may be dry etching or wet etching.

Figure 1C:
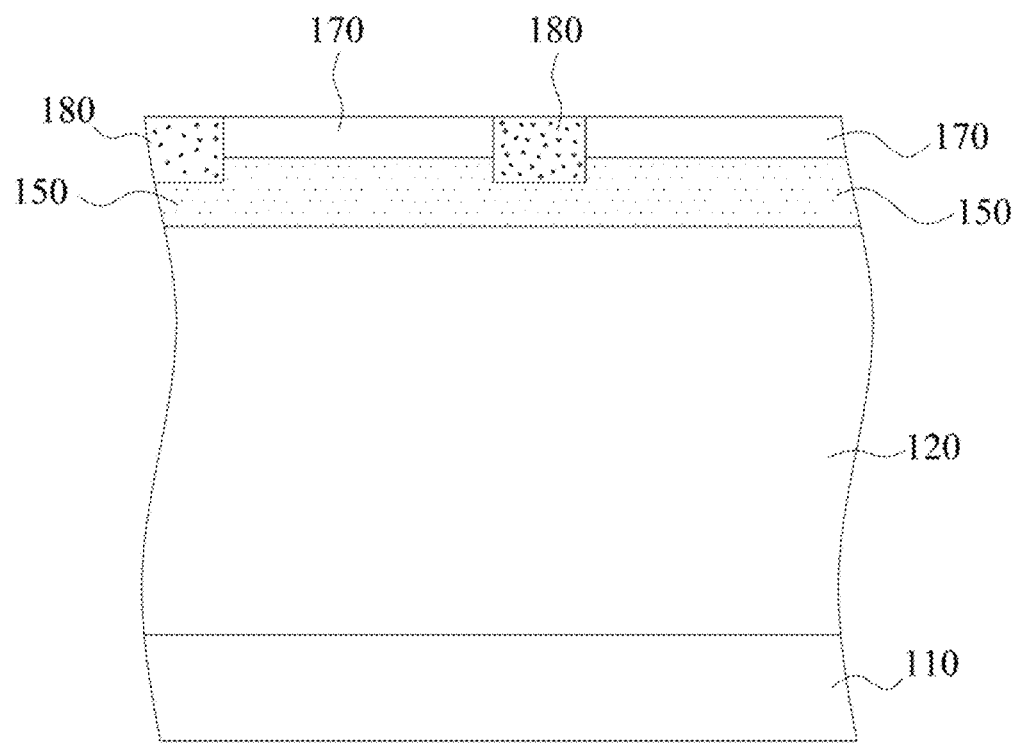

In FIG. 1C, a plurality of base-contacting regions 180 are first formed between the adjacent sources 170 in the epitaxial layer 120. Next, a first base region 150 is formed under the sources 170 and the base-contacting regions 180. The method of forming the base-contacting regions 180 and the first base region 150 are similar to the method of forming the sources 170, and therefore will not be described in detail. However, the electrical conductivity of both the base-contacting regions 180 and the first base regions 150 has to be opposite to that of the sources 170, that is, the second conductive type (for example, p-type). The ion implantation energy of the base-contacting regions 180 is, for example, about 10-200 keV, and the ion implantation energy of the first base regions 150 is, for example, about 10-800 keV. The depths of the first base regions 150 (calculated from the top surface of the epitaxial layer 120) are about 0.3-0.8 μm.

Figure 1D:
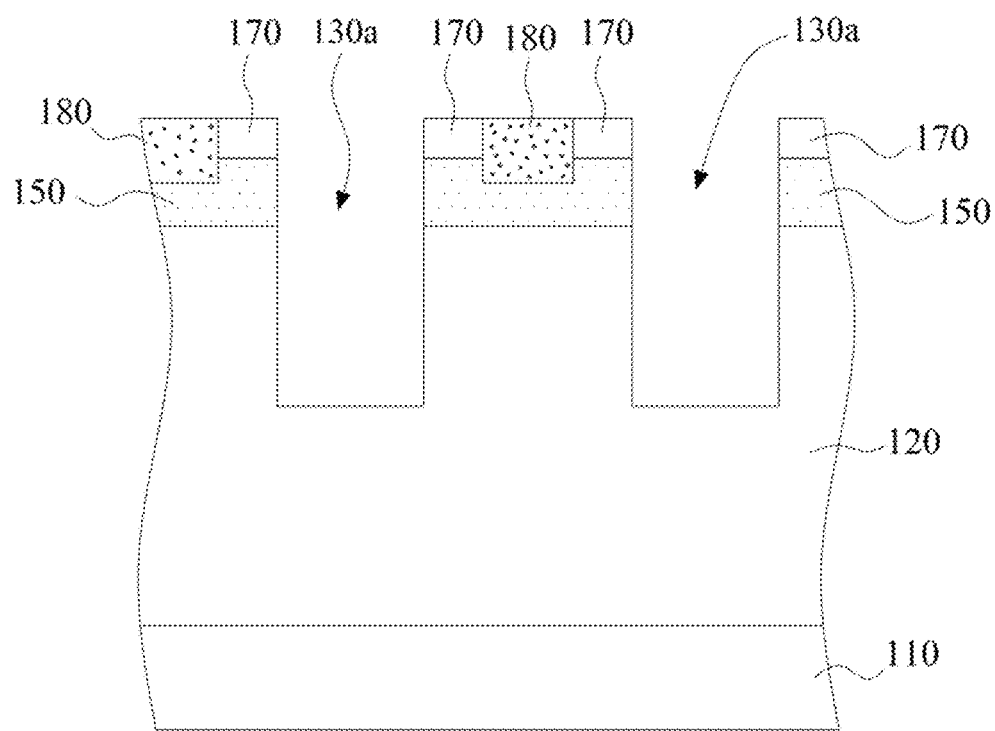

In FIG. 1D, a plurality of first trenches 130a are then formed in the epitaxial layer 120. The method of forming the first trenches 130a may specifically comprise the following steps.

First, an etching mask layer is formed on the epitaxial layer 120. The materials of the etching mask layer may be, for example, silicon oxide, silicon nitride, or silicon oxynitride. The method of forming the etching mask layer may be, for example, CVD. Next, another photoresist layer is formed on the etching mask layer, and the photoresist layer is then patterned by photolithography to have a desired pattern for exposing portions of the etching mask layer. Next, the exposed etching mask layer and epitaxial layer 120 thereunder are continually etched to penetrate the sources 170 to form the first trenches 130a. The depths of the first trenches 130a are about 0.5-1.5 μm.

Figure 1E:
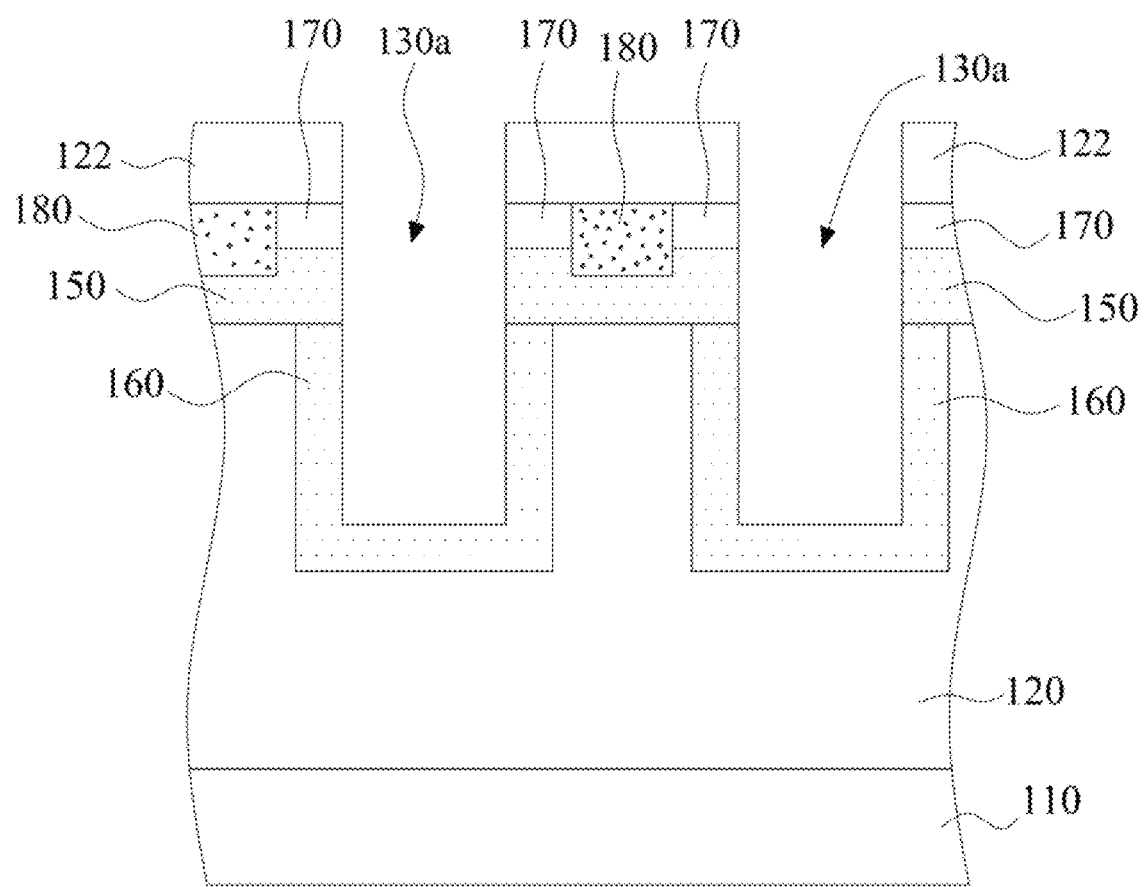

In FIG. 1E, an ion beam is implanted into the sidewalls of the first trenches 130a at an angle of about 0-60 degrees relative to the sidewalls of the trenches (that is, tilted ion implantation) to form a plurality of second base regions 160 in the epitaxial layer 120 surrounding the sidewalls and the bottoms of the first trenches 130a. The energy required for the ion implantation is about 10-1000 keV. The electrical conductivities of the second base regions 160 and the first base regions 150 are the same, that is, the second conductive type (for example, p-type). The depths of the second base regions 160 (calculated from the bottom surface of the first base layer 150) are about 0.5-1.0 μm.

Figure 1F:
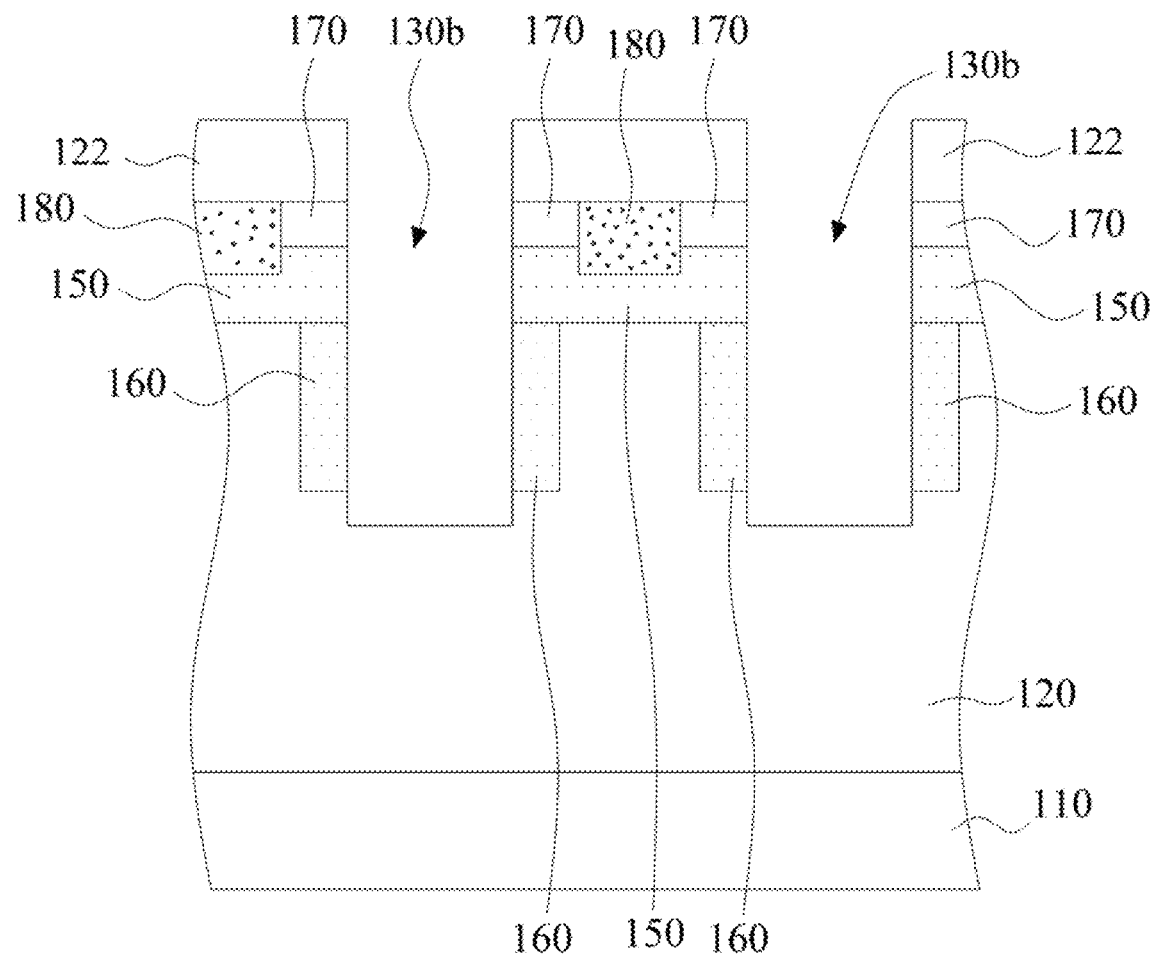

In FIG. 1F, the first trenches 130a are then continually etched to penetrate the bottom of the second base regions 160 to form the second trenches 130b. The method of etching may be dry etching, for example. The depths of the second trenches 130b are therefore deepened to about 1.0-2.5 μm.

Figure 1G:
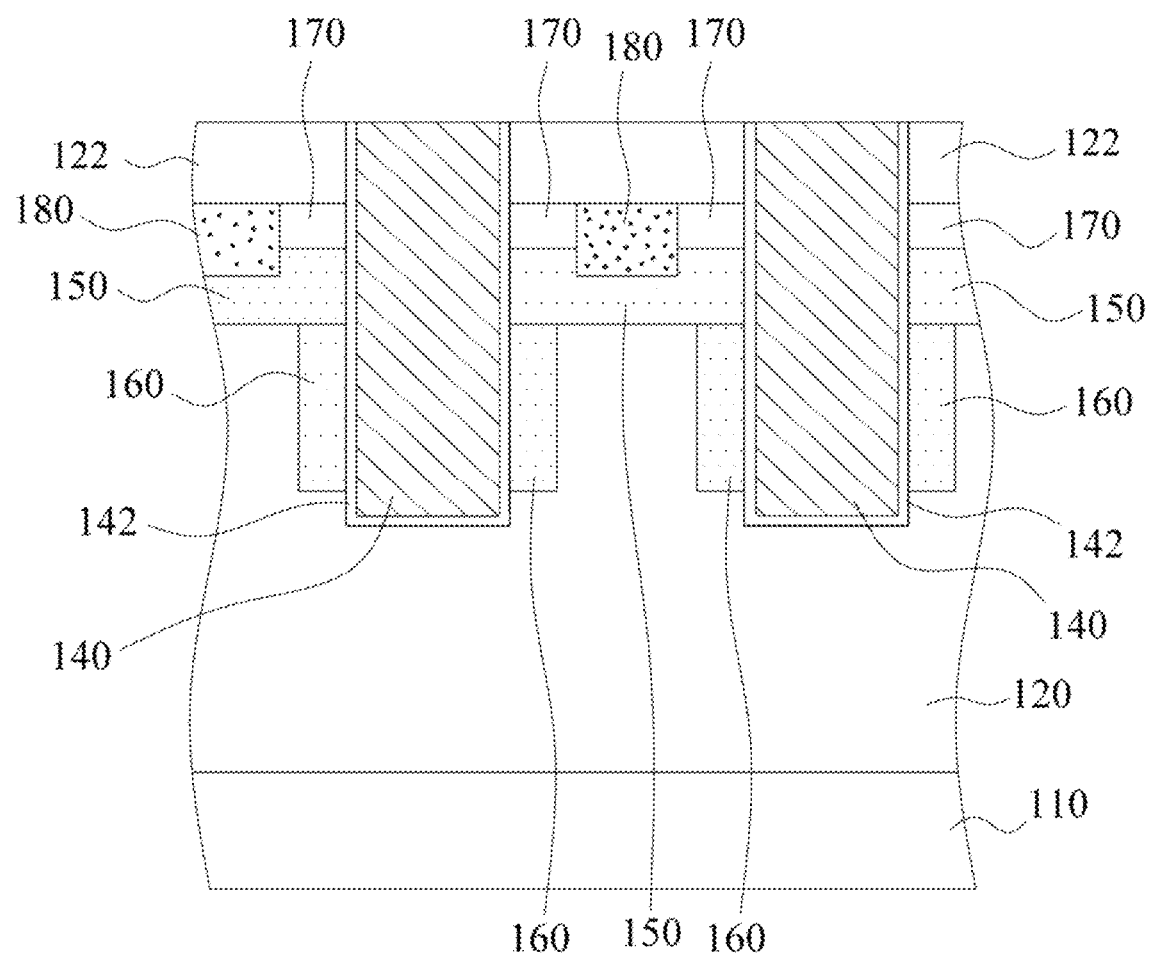

In FIG. 1G, a plurality of gate insulating layers 142 are respectively formed on the sidewalls and the inner surfaces of the bottoms of the second trenches 130b. The materials of the gate insulating layers 142 may be, for example, silicon oxide or other high dielectric constant insulating materials. The method of forming the gate insulating layers 142 may be, for example, thermal oxidation or CVD.

Next, a plurality of gates 140 are respectively formed in the second trenches 130b. The materials of the gates 140 may be conductive materials, such as metal (e.g., Al), doped polycrystalline silicon, metal nitride (e.g., TiN, TaN, WN, NbN or MoN), or metal silicide (e.g., TiSi$_2$, CoSi$_2$ or NiSi).

The method of forming the gates 140 comprises the following steps. A conductive layer is formed of a conductive material to cover the entire epitaxial layer 120 and fill the second trenches 130b. Optionally, the conductive layer above the epitaxial layer 120 is then removed to leave the conductive layer in the second trenches 130b as the gates 140. The method of removing the conductive layer may be, for example, etching back or chemical mechanical polishing (CMP).

Figure 1H:
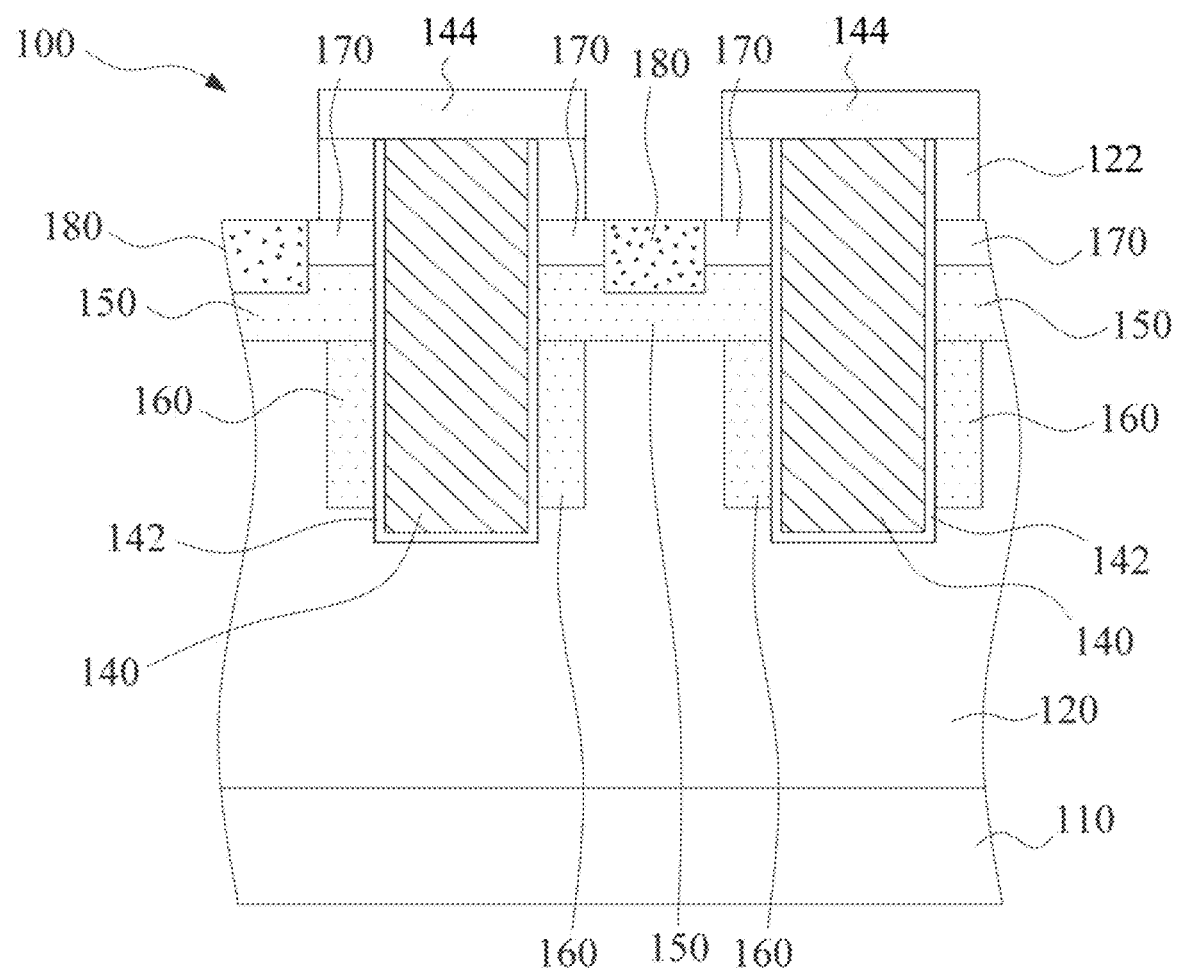

In FIG. 1H, a plurality of dielectric layers 144 are formed on the gates 140 and the hard mask layers 122, and then the dielectric layers 144 and the hard mask layers 122 are patterned by a photolithography process and an etching process to expose the sources 170 and the base-contacting regions 180. Next, a metal layer is formed to electrically connect the sources 170 to serve as an interconnect of the sources 170.

The structure of trench transistors will be specifically illustrated and described below.

To illustrate the structure of trench transistors more clearly, please refer to FIG. 1H again. In FIG. 1H, the structure of trench transistors 100 comprises a substrate 110, an epitaxial layer 120, a plurality of trenches 130b, a plurality of gate insulating layers 142, a plurality of gates 140, a plurality of first base regions 150, a plurality of second base regions 160, and a plurality of sources 170, described respectively as below.

The electrical conductivity of the substrate 110 is the first conductive type (for example, n-type), and is used as a drain 110 of the structure of trench transistors 100. The details of the substrate 110 are as described above, and therefore will not be further described here.

The epitaxial layer 120 is disposed on the substrate 110, that is, the epitaxial layer 120 is adjacent to the top surface of the substrate 110. The materials of the epitaxial layer 120 are as described above, and therefore will not be described in detail. In addition, the electrical conductivity of the epitaxial layer 120 may be the same as that of the substrate 110 (first conductive type, for example, n-type).

The second trenches 130b are respectively disposed in the epitaxial layer 120, that is, the second trenches 130b respectively extend from the top surface of the epitaxial layer 120 toward the direction of the substrate 110. The method for forming the second trenches 130b is as described above, and therefore will not be described in detail.

The gate insulating layers 142 are respectively disposed on the inner surfaces of the second trenches 130b, that is, the gate insulating layers 142 are respectively adjacent to the inner surfaces of the second trenches 130b. The inner surfaces of the second trenches 130b comprise the two sidewalls and the bottom surfaces of the second trenches 130b. In addition, the materials and the thickness range of the gate insulating layers 142 are as described above, and therefore will not be described in detail.

The gates 140 are respectively disposed on the inner surface of the gate insulating layers 142, that is, the gates 140 are respectively adjacent to the inner surface of the gate insulating layers 142. For example, the gates 140 are respectively disposed on the gate insulating layers 142 and fill in the second trenches 130b. The materials of the gates 140 are as described above, and therefore will not be described in detail.

The first base regions 150 are respectively disposed in the epitaxial layer 120 between the adjacent second trenches 130b, that is, the first base regions 150 are respectively adjacent to the two adjacent second trenches 130b. Each of the first base regions 150 has a first depth extending downward from the top surface of the epitaxial layer 120 (that is, toward the direction of the substrate 110), and for example, the first depth is about 0.3-1.0 μm. In addition, the electrical conductivities of the first base regions 150 are the second conductive type (for example, p-type) opposite to that of the epitaxial layer 120.

The second base regions 160 are respectively disposed in the epitaxial layer 120 adjacent the sidewalls of the second trenches 130b, that is, the second base regions 160 may be respectively adjacent to both the second trenches 130b and the first base regions 150. Each of the second base regions 160 has a second depth extending downward from the bottom surface of the first base regions 150 (that is, toward the direction of the substrate 110), and for example, the second depth is about 0.5-1.0 μm. In addition, the electrical conductivities of the second base regions 160 are the same second conductive type as that of the first base regions 150, for example, p-type.

The sources 170 are respectively disposed in the first base regions 150 beside the sidewalls of the second trenches 130b, that is, the sources 170 are adjacent to the sidewalls of the second trench 130b. Therefore, the sources 170 will be disposed between the two adjacent second trenches 130b and each of the sources 170 is adjacent to the two adjacent second trenches 130b. The materials of the sources 170 are as described above, and therefore will not be described in detail. In addition, the electrical conductivities of the sources 170 are the first conductive type (for example, n-type) opposite to that of the first base regions 150.

According to still another embodiment, the structure of trench transistors 100 further comprises a plurality of base-contacting regions 180. The base-contacting regions 180 are disposed in the first base regions 150 between the adjacent sources 170, that is, the base-contacting regions 180 are respectively adjacent to the two adjacent sources 170. The materials of the base-contacting regions 180 are as described above, and therefore will not be described in detail. In addition, the electrical conductivities of the base-contacting regions 180 are the same second conductive type as that of the first base regions 150, for example, p-type.

According to still another embodiment, the structure of trench transistors 100 further comprises a plurality of dielectric layers 144. The dielectric layers 144 are disposed on the gates 140 (or further on a hard mask layer 122), so as to cover the gates 140 to keep the gates 140 in an electrically insulated state. The materials and method of forming the dielectric layers 144 are as described above, and therefore will not be described in detail. The materials of the dielectric layers 144 and method of forming the dielectric layers 144 are as described above, and therefore will not be described in detail.

The physical characteristics of the structure of trench transistors 100 are further described below.

In the embodiments of the invention, the structure of trench transistors 100 has an inverted U-shaped base region comprising the first base regions 150 and the second base region 160, that is, the region surrounded by the inverted U-shaped base region is not additionally doped by ions. However, the base regions of the conventional structure of trench transistors have additionally doped ions in the same regions. The above two transistors are tested for the junction capacitance ($C_{B-D}$), and the relationship between the junction capacitance ($C_{B-D}$) and the voltage ($V_{B-D}$) are further plotted as shown in FIG. 2.

Figure 2:
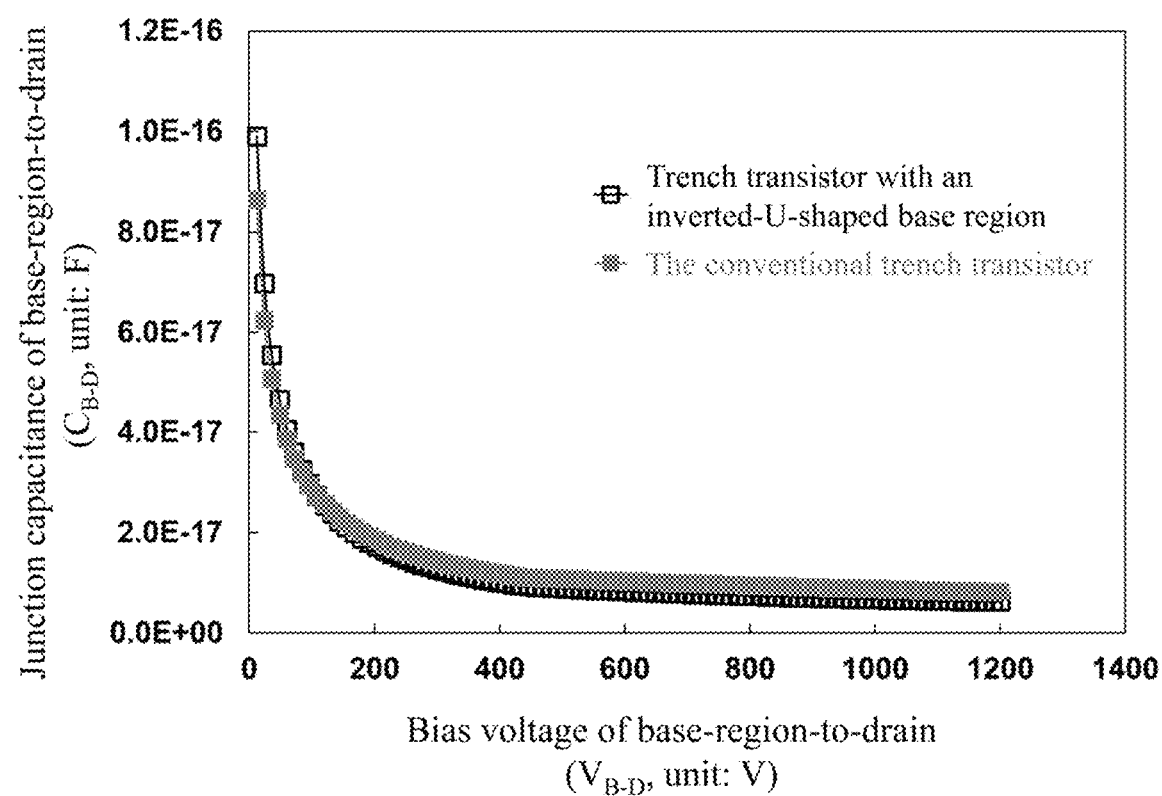
FIG. 2 is a comparison diagram of the junction capacitance of the base-to-drain ($C_{B-D}$) of a structure of trench transistors according to an embodiment of the invention and that of a conventional structure of trench transistors.

FIG. 2 is a comparison diagram of the junction capacitance of the base-to-drain ($C_{B-D}$) of a structure of trench transistors according to an embodiment of the invention and that of a conventional structure of trench transistors. In FIG. 2, when a low bias voltage (for example, $V_{B-D}$<65 V) is applied, a higher $C_{B-D}$ is obtained owing to a larger surface region of the inverted U-shaped base region according to an embodiment of the invention. However, when a higher bias voltage (for example, $V_{B-D}$>65 V) is applied, a lower $C_{B-D}$ is obtained compared to that of the conventional structure of trench transistors because the region surrounded by the inverted U-shaped base region is completely depleted. More specifically, the $C_{B-D}$ is further converted into the charge $Q_{B-D}$ that is required to overcome for actual on-off switching. The charge $Q_{B-D}$ accumulated by the junction capacitance $C_{B-D}$ according to the embodiment of the invention will be lower than that of the conventional structure of trench transistors at about 9%.

Figure 3:
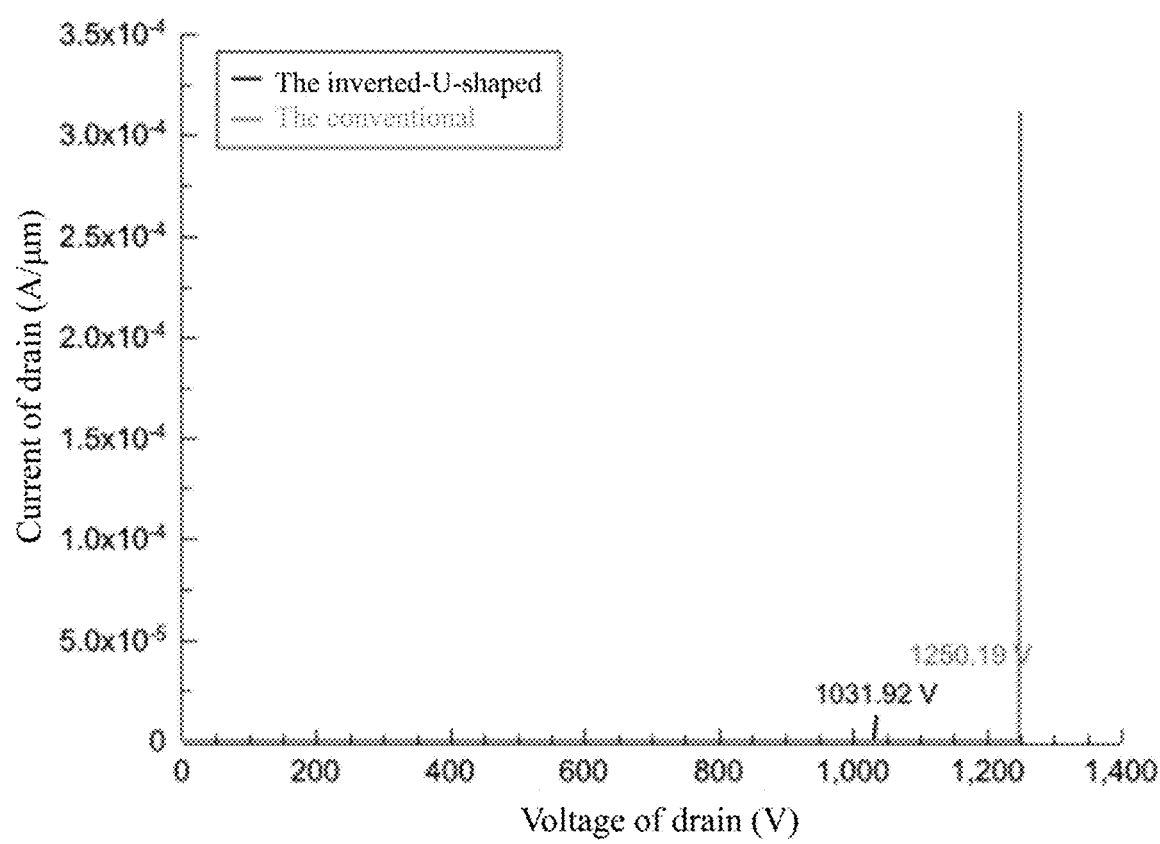
FIG. 3 is a characteristics comparison diagram of reverse-bias-voltage-to-current between a structure of trench transistors according to an embodiment of the invention and a conventional structure of trench transistors.

A breakdown test is performed on the conventional structure of trench transistors and the structure of trench transistors according to the embodiment of the invention with the same dopant concentration, and the result is shown in FIG. 3. FIG. 3 is a characteristics comparison diagram of reverse-bias-voltage-to-current between a structure of trench transistors according to an embodiment of the invention and a conventional structure of trench transistors. In FIG. 3, the breakdown voltage of the base region according to the embodiment of the invention is about 1031.92 V, while that of the conventional base region is about 1250.19 V. This is the comparison result of using the same dopant concentration in the inverted-U-shaped base region according to the embodiment of the invention and the conventional base region. However, the embodiments of the invention only need to adjust the concentration of the first base regions 150, the second base regions 160, or the epitaxial layer 120, and/or adjust the depth of the first base regions 150 and the second base regions 160 to easily reach a specific acceptable breakdown voltage. For example, for a product with a voltage rating of 1200 V, the breakdown voltage of 1450 V must be reached after adjusting the above manufacturing process. For another example, products with a voltage rating of 600 V, the breakdown voltage of 720 V must be reached after adjusting the manufacturing process. That is, even though the embodiment of the invention has the disadvantage of reduced breakdown voltage, it may be still overcome after adjusting the above manufacturing process without sacrificing the quality of using the embodiment of the invention as a power device.

According to the above embodiments of the invention, the junction capacitance $C_{B-D}$ between the base regions and the drain can be reduced due to the configuration of the inverted-U-shaped base region. That is to say, only a small amount of charge transfer per unit time is needed to complete the on/off switching of a device. Therefore, the structure of trench transistors with the inverted-U-shaped base region according to the embodiment of the invention may claim effects of shortening the time to charge/discharge and accelerating the on/off switching rate. Meanwhile, compared with the conventional structure of trench transistors, the embodiments of the invention can provide a manufacturing process of a U-MOSFET with a lower cost, a shorter required time and simpler steps, and can achieve the same or even better performance and quality.

The invention is only disclosed with some embodiments herein. However, anyone familiar with the technical field or skilled in the art should understand that the embodiments of the invention are only used to describe the invention, and not intended to limit the scope of patent rights claimed by the invention. Any changes or substitutions that are equivalent to the embodiments should be construed as being included within the spirit or scope of the invention. Therefore, the scope of protection of the invention shall be defined by the claims of patent application described below.

What is claimed is:

1. A structure of trench transistors, comprising:
a substrate having a first conductive type and serving as a drain of the structure of trench transistors;
an epitaxial layer disposed on the substrate and having the first conductive type;
a plurality of trenches disposed in the epitaxial layer;
a plurality of gate insulating layers disposed on the inner surfaces of the trenches;
a plurality of gates respectively disposed on the gate insulating layers;
a plurality of first base regions respectively disposed in the epitaxial layer between the adjacent trenches, having a first depth from the top surface of the epitaxial layer, and having a second conductive type opposite to the first conductive type;
a plurality of second base regions respectively disposed in the epitaxial layer beside sidewalls of the trenches, having a second depth from the bottom surface of the first base regions, and having the second conductive type, wherein the second depth is larger than the first depth, and wherein one of the first base regions and two of the second base regions between adjacent two of the trenches are combined to form an inverted-U-shaped base region, and a region surrounded by the inverted-U-shaped base region is not additionally doped by ions; and
a plurality of sources respectively disposed in the first base regions beside the sidewalls of the trenches and having the first conductive type.

2. The structure of trench transistors of claim 1, further comprising a plurality of dielectric layers respectively covering the gates.

3. The structure of trench transistors of claim 1, further comprising a plurality of hard mask layers respectively disposed on the epitaxial layer and surrounding sidewalls of the gate insulating layers.

4. The structure of trench transistors of claim 3, further comprising a plurality of dielectric layers respectively covering the gates and the hard mask layers.

5. The structure of trench transistors of claim 1, further comprising a plurality of base-contacting regions disposed in the first base regions between the adjacent sources and having the second conductive type.

6. The structure of trench transistors of claim 5, further comprising a plurality of dielectric layers respectively covering the gates.

7. The structure of trench transistors of claim 5, further comprising a plurality of hard mask layers respectively disposed on the epitaxial layer and surrounding sidewalls of the gate insulating layers.

8. The structure of trench transistors of claim 7, further comprising a plurality of dielectric layers respectively covering the gates and the hard mask layers.

* * * * *